(12) United States Patent  (10) Patent No.: US 7,833,835 B2
Aoyagi et al.  (45) Date of Patent: Nov. 16, 2010

(54) MULTI-LAYER FIN WIRING INTERPOSER FABRICATION PROCESS

(75) Inventors: Masahiro Aoyagi, Ibaraki (JP); Hiroshi Nakagawa, Ibaraki (JP); Kazuhiko Tokoro, Ibaraki (JP); Katsuya Kikuchi, Ibaraki (JP); Yoshikuni Okada, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 203 days.

(21) Appl. No.: 11/890,502

(22) Filed: Aug. 7, 2007

(65) Prior Publication Data

US 2008/0044950 A1 Feb. 21, 2008

Related U.S. Application Data

(62) Division of application No. 10/869,963, filed on Jun. 18, 2004, now abandoned.

(30) Foreign Application Priority Data

Jun. 20, 2003 (JP) ............................ 2003-175743
Sep. 11, 2003 (JP) ............................ 2003-320295

(51) Int. Cl.
*H01L 21/60* (2006.01)
(52) U.S. Cl. ................. 438/118; 257/758; 257/E21.507
(58) Field of Classification Search ................. 257/700, 257/758, 759, E23.062, E23.142, E23.145, 257/E23.153, E23.173
See application file for complete search history.

(56) References Cited

U.S. PATENT DOCUMENTS 3,822,467 A  7/1974  Symersky et al.
5,321,210 A * 6/1994  Kimbara et al. ............. 174/256
6,246,102 B1  6/2001  Sauerbrey et al.
6,462,427 B2 * 10/2002  Sakiyama et al. ........... 257/786
6,591,491 B2 * 7/2003  Fujii et al. .................... 29/830
6,627,377 B1  9/2003  Itatani et al.
7,057,279 B2 * 6/2006  Ogawa ....................... 257/728
2001/0012596 A1  8/2001  Kunimoto et al.
2002/0071256 A1  6/2002  Figueroa et al.
2002/0109232 A1  8/2002  Lin et al.
2002/0160600 A1 * 10/2002  Eckert et al. ................ 438/623

FOREIGN PATENT DOCUMENTS

JP  08-279672 A  10/1996

(Continued)

OTHER PUBLICATIONS

Office Action mailed on Oct. 23, 2007 (Japan).

(Continued)

*Primary Examiner*—Benjamin P Sandvik
(74) *Attorney, Agent, or Firm*—Rader, Fishman & Grauer PLLC

(57) ABSTRACT

An interposer having multi-layer fine wiring structure which comprises an insulating layer made of photosensitive polyimide which is photosensitive organic material and a wiring layer portion made of metal, such as copper, silver, gold, aluminum, palladium, indium, titanium, tantalum, and niobium, functions as wiring in an integrated circuit chip, wherein junctions between the integrated circuit chip and the interposer are formed by micron to submicron size fine connection metal pads or bumps which are formed on both the integrated circuit chip and the interposer.

4 Claims, 11 Drawing Sheets

FOREIGN PATENT DOCUMENTS

| | | |
|---|---|---|
| JP | 2000-299505 A | 10/2000 |
| JP | 2001-102479 A | 4/2001 |
| JP | 3213722 B2 | 7/2001 |
| JP | 2003-309121 A | 10/2003 |
| JP | 2004-047744 A | 2/2004 |

OTHER PUBLICATIONS

Takahashi et al., "Current Status of Research and Development for Three-Dimensional Chip Stack Technology," Japan Journal of Applied Physics, vol. 40, Pt. 1, No. 4B, pp. 3032-3037, The Japan Society of Applied Physics (Apr. 2001).

* cited by examiner

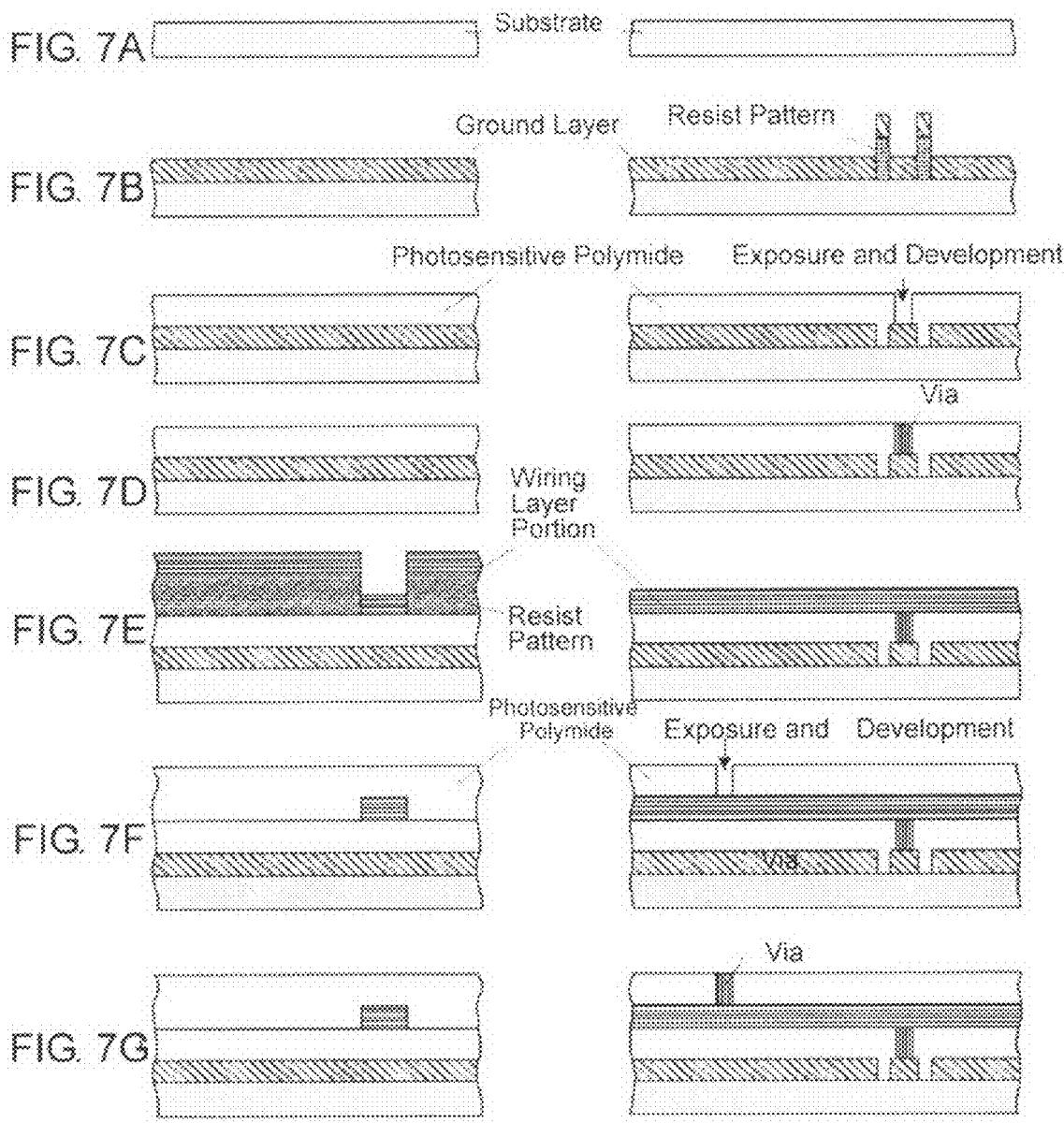

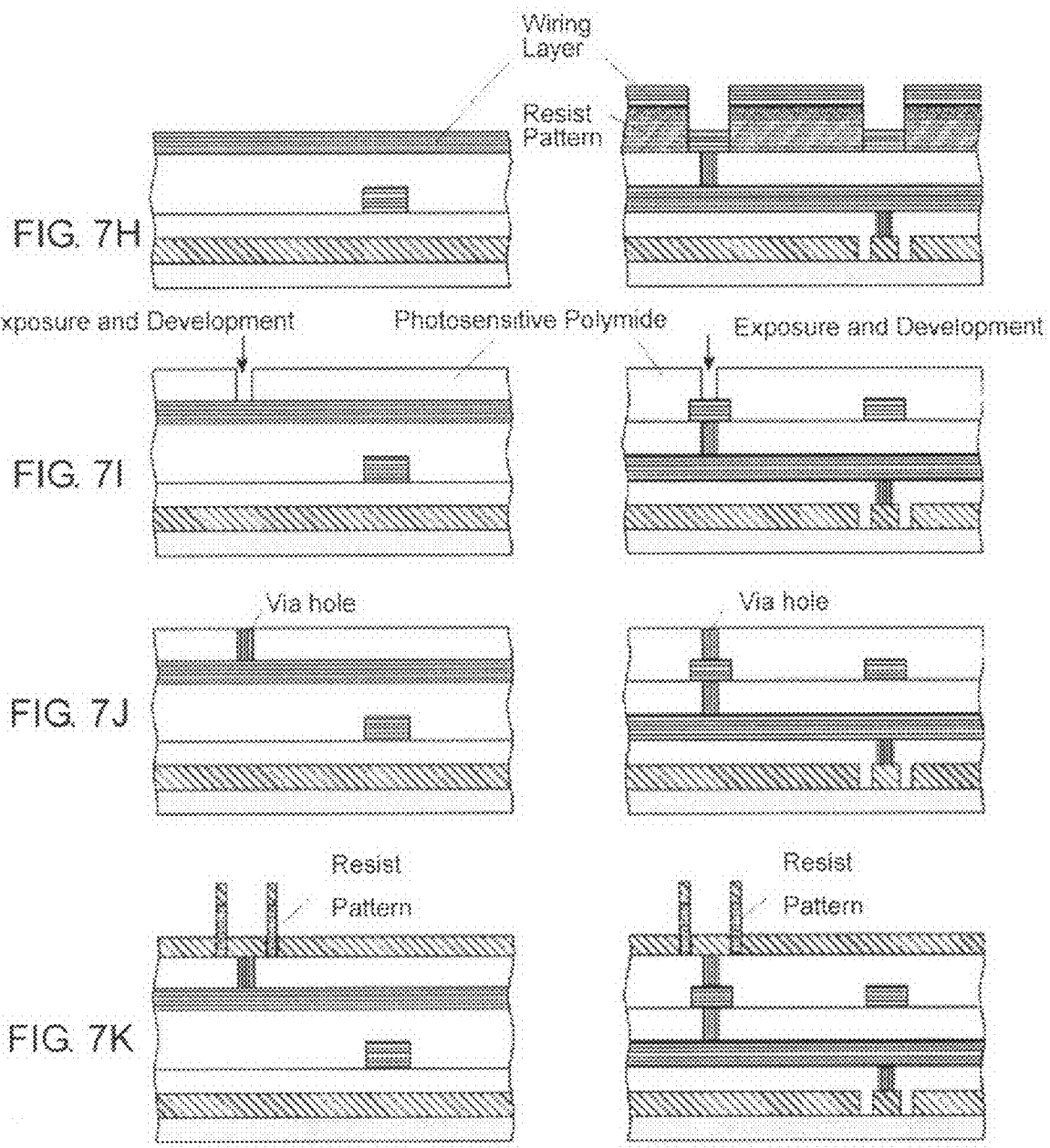

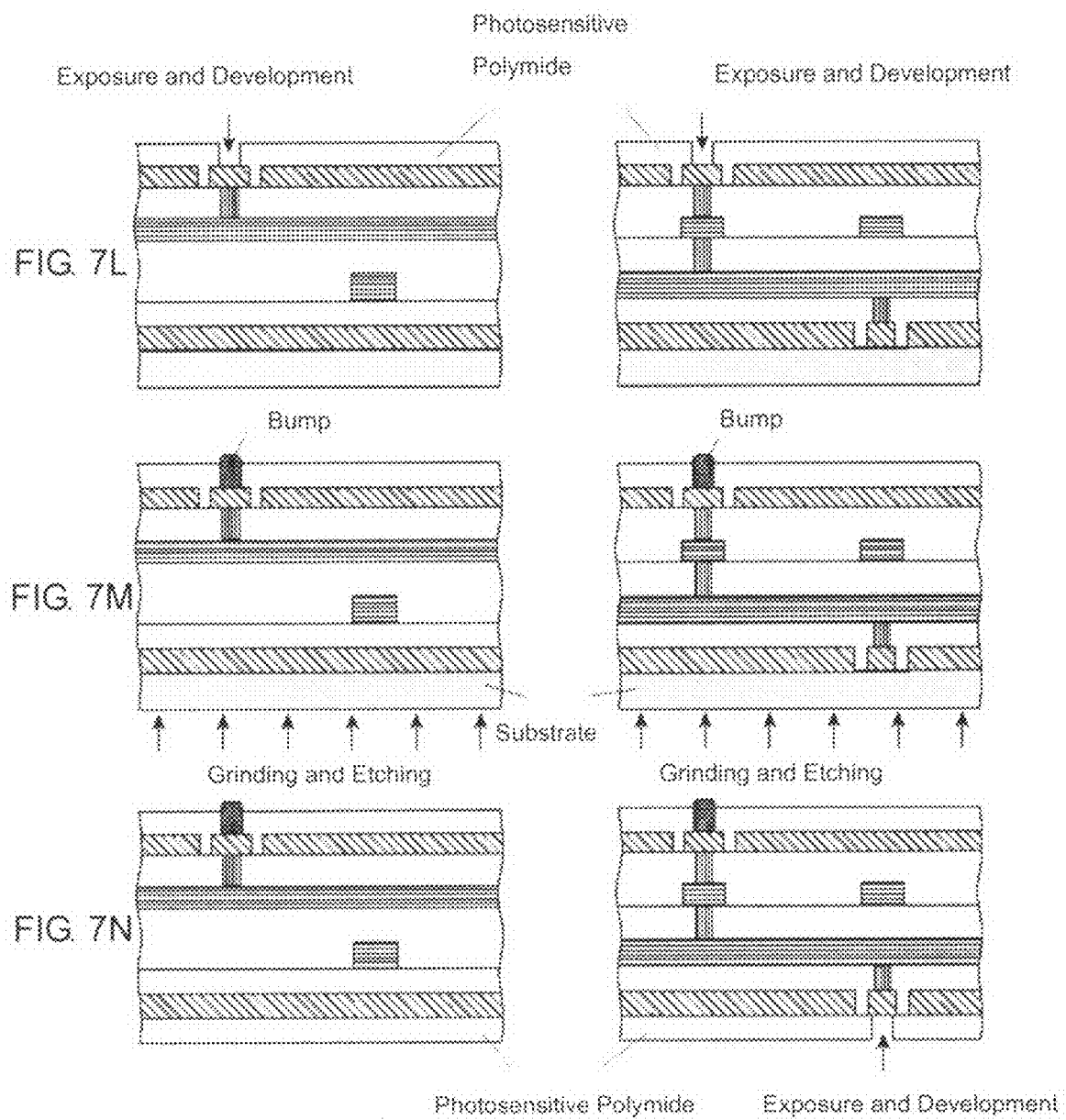

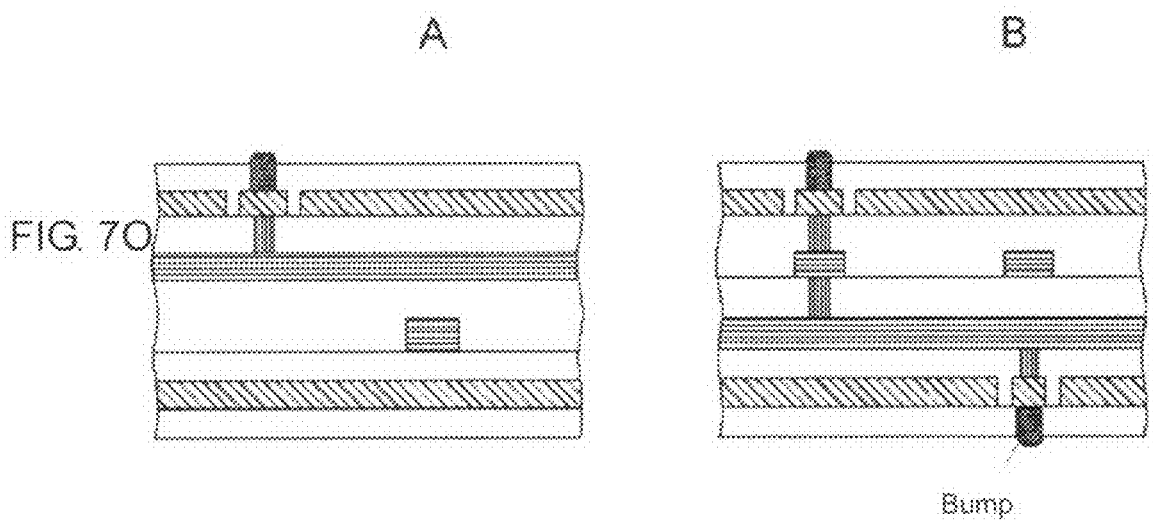

MULTI-LAYER FIN WIRING INTERPOSER FABRICATION PROCESS

CROSS REFERENCE TO RELATED APPLICATIONS

The present application is a Divisional Application of patent application Ser. No. 10/869,963, filed on Jun. 18, 2004.

TECHNICAL FIELD OF THE INVENTION

The present invention relates to an interposer (which corresponds to a conventional package and circuit board etc.) having a multi-layer fine wiring structure which is used for supplying many signals and large power to a digital integrated circuit chip(s) for high speed information processing, wherein the multi-layer fine wiring structure has an insulating layer of a photosensitive organic film and a wiring layer portion made of metal, such as cupper, silver, gold, aluminum, palladium, indium, titanium, tantalum, and niobium.

DESCRIPTION OF RELATED ART

Specifically, by using the photosensitive organic film which has the high resolution property of from a micron to submicron level as an insulating layer, fine via hole processing of an insulating layer is carried out only by a lithography process. Compared with the conventional multi-layer wiring technology, the high-density wiring structure is realizable by forming a pattern on the metallic wiring layer by the lift-off method.

In the conventional method, a multi-layer wiring in a mounting system such as a package or a circuit board in which an integrated circuit chip is contained is generally used, wherein the wiring comprises an insulating layer made of an organic layer such as epoxy, polyimide, a liquid crystal polymer and TEFLON (registered trademark), and ceramics such as aluminum nitride and an alumina, and a metallic wiring layer made of copper, silver, gold, aluminum, palladium, indium, titanium, tantalum, niobium etc.

The multi-layer wiring is made by a metallic wiring layer deposition based on a plating technique, and fine wiring processing based on a chemical etching technique, wherein realizable wiring width thereof is about 50 microns.

However, there is no limit to the needs of a multi-layer wiring having higher wiring density, and there is strong desire for a 50 microns or less wiring width, especially, for a micron order wiring width.

In wiring as a signal line, there are the needs of uniformity and repeatability with respect to characteristic impedance in the line, in order to fully demonstrate the capacity of high-speed signal transmission.

In a wiring layer portion (which comprises a plurality of layers) of an integrated circuit chip, about five to ten layers are usually used.

Since an area where the wiring occupies within the chip can be decreased when the number of layers of the wiring layer portion in the integrated circuit chip is increased, it is generally possible to design a small chip.

On the other hand, when the chip size is fixed and the number of layers of the wiring layer portion in an integrated circuit chip is increased, it is possible to sharply increase the number of devices integrated in a chip. That is, a degree of device integration can be improved.

However, since in the conventional method of increasing the number of layers in the wiring layer portion in the integrated circuit chip, the number of the wiring processes increases, a steep rise of the chip manufacturing cost is brought about.

There is concern that the remarkable fall of a manufacturing yield occurs.

In the multi-layer wiring technology in the conventional mounting system, about 50 microns was a limit as realizable wiring width.

SUMMARY OF THE INVENTION

In view of the above problems, it is an object of the present invention to realize reduction of the manufacturing cost and increase the chip manufacturing yield ratio by transposing part of wiring layers in an integrated circuit chip to an interposer.

According to the present invention, an interposer having multi-layer fine wiring structure which comprises an insulating layer made of photosensitive polyimide which is photosensitive organic material and a wiring layer portion made of metal, such as copper, silver, gold, aluminum, palladium, indium, titanium, tantalum, and niobium, functions as (part of wiring or) wiring in an integrated circuit chip, wherein junctions between the integrated circuit chip and the interposer are formed by micron to submicron size fine connection metal pads or bumps which are formed on both the integrated circuit chip and the interposer.

When, part of the wiring layer portion in the integrated circuit chip (especially a global wiring portion for a long distance wiring connection in the chip) is replaced with the interposer, it is possible to increase chip manufacturing yield ratio and reduce the manufacturing cost. In addition, by increasing the number of layers in the wiring layer portion of the interposer, it is possible to reduce the size of the chip so that steep rise of the chip manufacturing yield ratio and steep reduction of the manufacturing cost can be expected.

By using photosensitive polyimide as an insulating layer, via hole processing of the insulating layer can be carried out by only a lithography process, and by forming a pattern of metal wiring layer by a lift-off method, it is possible to sharply simplify the process, compared with the conventional multi-layer wiring technology.

The present invention will become more apparent from the following detailed description of the embodiments and examples of the present invention.

DESCRIPTION OF THE DRAWINGS

FIGS. 7A-7O show steps of the manufacturing process of an interposer having a fine wiring structure, each of which shows two cross sectional views of the structure.

DETAILED DESCRIPTION OF THE INVENTION

Embodiments of the present invention will be described below, referring figures.

Figure 1:
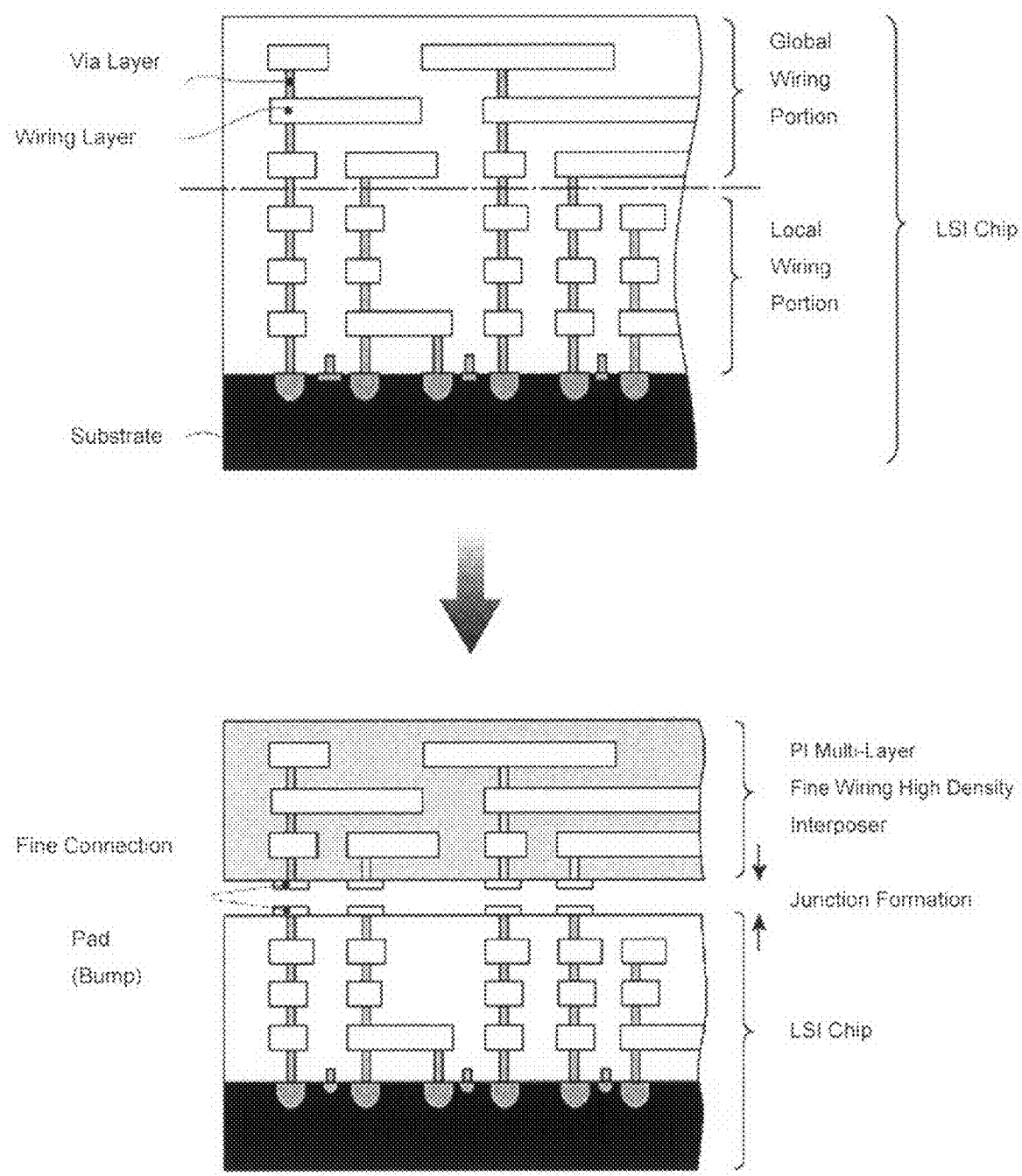
FIG. 1 shows a cross sectional view of a conventional integrated circuit chip (LSI chip) and an integrated circuit chip (LSI chip) in which the number of layers in a wiring layer portion is reduced and an interposer having a wiring layer portion is replaced with part of the conventional integrated circuit chip.

FIG. 1 shows a cross sectional view of a conventional integrated circuit chip (LSI chip) and an integrated circuit chip (LSI chip) in which the number of layers in a wiring layer portion is reduced and an interposer having a wiring layer portion is replaced with part of the conventional integrated circuit chip.

For example, as shown in FIG. 1, three wiring layers from the top of the conventional integrated circuit (LSI) chip having six layers in a wiring layer portion (especially, a global wiring layer portion for a long distance wiring connection in the chip) are replaced with an interposer having three wiring layers (whose number is the same as that of reduced number layers in the wiring layer portion), wherein in order to electrically connect the interposer and the chip whose number of layers in the wiring layer portion is reduced, metallic junctions are formed by using micron size fine connection metal pads or bumps which are formed on the interposer and the chip as shown in the bottom of FIG. 1.

The interposer according to the present invention is used in order to supply many signals and large power to the digital integrated circuit chip for high-speed-information processing.

The logical circuit structure of a gate array type LSI can be changed only by changing wiring of the interposer, that is, by replacing the global wiring of the LSI with the interposer which has a fine multi-layer wiring.

The interposer has an insulating layer made of photosensitive organic material which has micron order resolution, and a wiring layer portion made of metal, such as copper, silver, gold, aluminum, palladium, indium, titanium, tantalum, and niobium, wherein the interposer is an alternative of part of the wiring layer portion in an integrated circuit chip, specifically, the multi-layer fine wiring structure which can serve as an alternative of the global wiring.

The interposer according to the present invention has the fine connection metal pads or bumps whose size is approximately the same as that of the micron size fine connection metal pad of the chip, and corresponds to the conventional package and the conventional circuit board, etc.

A manufacturing process of the interposer which has multi-layer fine wiring structure is described below.

Figure 8:
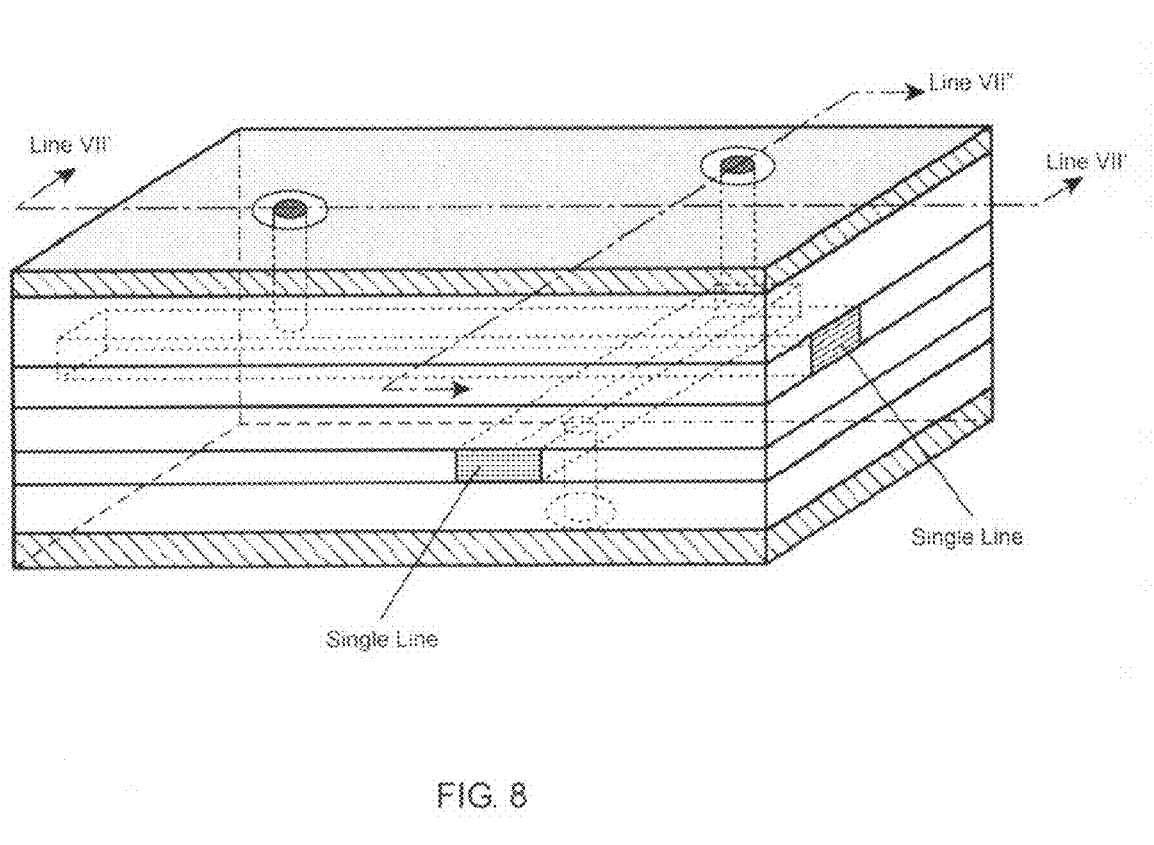
FIG. 8 is a perspective view of the structure wherein Line VII' and Line VII" are shown.

FIGS. 7A-7O show steps of the manufacturing process of the structure. A view of the structure shown in the left side of each of FIGS. 7A-7O, is a cross sectional view thereof taken along Line VII' shown in FIG. 8, and a view of the structure shown in the right side of each of FIGS. 7A-7O is a cross sectional view thereof taken along Line VII" shown in FIG. 8, wherein FIG. 8 shows a schematic perspective view of part of the multi-layer fine wiring structure.

In the figure, as an example, a dual strip line structure suitable for high speed signal transmission is shown, wherein two lines are arranged so as to cross at right angle.

A resist pattern for forming an extraction electrode(s) is formed on a wafer-shaped flat and smooth substrate shown in FIG. 7A, which is made of silicon, quartz, sapphire, and a gallium arsenide and the like by a lithography technology. Then, copper, silver, gold, aluminum, palladium, indium, titanium, tantalum, niobium, etc. are deposited on the substrate in order to form a ground layer, and the film on the resist pattern is removed by the lift-off method as shown in FIG. 7B.

When as the ground layer, noble metal such as gold, silver and palladium is used, since they do not have good adhesion with the organic film insulating layer formed on to the ground layer, it is necessary to improve the adhesion by depositing ultra-thin aluminum film of about 5 to 10 nm thickness on the surface of the noble metal.

When silicon is used as a substrate, since the organic film insulating layer does not have good adhesion with a silicon substrate, it is necessary to improve the adhesion by applying silane type coupling agent before depositing the organic film.

After this step, an improvement of adhesion of the organic film insulating layer on noble metal is similarly carried out by the ultra thin aluminum.

Then, a photosensitive organic film is formed by a spin-on coating method, using high resolution photosensitivity organic material, and a via hole(s) is formed in the organic film insulating layer by exposure and development as shown in FIG. 7C, and the via hole is filled up with copper, silver, gold, palladium or the like by a plating method as shown in FIG. 7D.

Then, after a resist pattern for forming a first wiring is formed with a lithography technology, a wiring layer portion made of copper, silver, gold, aluminum, palladium, indium, titanium, tantalum, niobium, etc. is deposited, and the film on the resist pattern is removed by the lift-off method as show in FIG. 7E.

Then, a photosensitive organic film is formed by a spin-on coating method, using high resolution photosensitivity organic material, and a via hole(s) is formed in the organic film insulating layer by exposure and development as shown in FIG. 7F, and the via hole is filled up with copper, silver, gold, palladium, or the like by a plating method as shown in FIG. 7G.

Then, after a resist pattern for forming a second wiring is formed with a lithography technology, a wiring layer portion made of copper, silver, gold, aluminum, palladium, indium, titanium, tantalum, niobium or the like is deposited. The film on the resist pattern is removed by the lift-off method as show in FIG. 7H.

Then, a photosensitive organic film is formed by a spin-on coating method, using high resolution photosensitivity organic material, and a via hole(s) is formed in the organic film insulating layer by exposure and development as shown in FIG. 7I, and the via hole is filled up with copper, silver, gold, palladium, or the like by a plating method as shown in FIG. 7J.

As shown in FIG. 7K, a resist pattern for forming an extraction electrode(s) is formed thereon, and copper, silver, gold, aluminum, palladium, indium, titanium, tantalum, niobium, etc. are deposited thereon by a lithography process in order to form a ground layer, and then a film on the resist pattern is removed by the lift-off method as shown in FIG. 7K.

Then, a photosensitive organic film is formed by a spin-on coating method, using high resolution photosensitivity organic material, and a bump hole(s) is formed in the organic film insulating layer by exposure and development as shown in FIG. 7L, and the bump hole is filled up with copper, silver, gold, palladium, or the like by a plating method as shown in FIG. 7M.

Then, the substrate is made thin by grinding, and the ground layer which has been previously formed by dry etching is exposed as shown in FIG. 7M.

The technique using an adhesive tape which can be re-exfoliated by UV irradiation as described below may be used for removing the substrate, in place of the grinding and dry etching.

That is, a transparent substrate (made of a quartz, glass, etc.) is prepared at the beginning of the interposer forming process, and a UV irradiation re-exfoliation type adhesive tape is stuck thereon.

After that, the forming process described above is advanced, and ultraviolet rays (UV) are irradiated from a back side of the substrate after completion of a fine multi-layer wiring, whereby the adhesion of the adhesive tape is eliminated so as to peel off the interposer from the substrate.

Then, a photosensitive organic film is formed by a spin-on coating method, using high resolution photosensitivity organic material, and a bump hole(s) is formed in the organic film insulating layer by exposure and development as shown in FIG. 7N, and the bump hole is filled up with copper, silver, gold, palladium; or the like by a plating method as shown in FIG. 7O.

It is possible to form a single trip line in one layer in a wiring layer portion by proceeding from the step shown in FIG. 7G to the step shown in 7K.

When further multi-layering of the wiring layer is necessary, it is possible to increase the number of layers in a wiring layer portion one by one by returning to the process shown in FIG. 7C from the process shown in FIG. 7K, and repeating a series of the layer forming process.

In case that photosensitive block co-polymerized polyimide is used as the high resolution photosensitivity organic material, when the polyimide is applied, two kinds of the following methods for making the surface flat after the application is used.

Both methods may be used if needed.

(A) In a pre-baking process, the surface is baked at a certain temperature (for example 70 degrees) lower than a predetermined temperature (for example, 90 degrees Celsius) and then the process temperature is raised to the predetermined temperature.

By processing at the low temperature, a fluidity is maintained for a while, and it flows into a groove pattern during the period thereby accelerating the planarizing.

(B) By carrying out a heat and pressure press after the application of the photosensitive polyimide insulating layer, projected portions are planarized.

As to the surface of the pressing machine to be used, a low adherence which is obtained by TEFLON (registered trademark) resin coat processing etc. is required in a high temperature environment.

In case that the temperature at time metallic junctions are formed by using bumps is 250 to 350 degrees Celsius, although 25 to 30% reduction of the film thickness of a photosensitive polyimide insulating layer can be observed by drying it by heat-treating at a high temperature of 280 to 300 degrees Celsius after exposure and development, it is possible to avoid uneven contraction of the film thickness due to the heat at the time of the above-mentioned junction formation.

When a via hole(s) which is finer than the resolution of the high resolution photosensitive organic material is formed in an insulating layer, an organic film is formed by spin-on coating, using organic material to which photosensitivity is not given, and then a resist pattern is formed in order to form a via hole(s) with a lithography technology, and further, the via hole is processed by dry etching.

When two or more layers of organic insulating films are in piles formed with the spin-on coating, it is possible to control reduction of the film thickness since the surface of the films is not dissolved but a lower organic insulating layer(s) is dissolved due to organic solvent of the organic insulating films applied in piles, by using a surface processing such as plasma, electron ray, Deep-UV, etc. which are disclosed in Japanese Laid Open Patent No. 2004-47744 (Japanese Patent Application No. 2002-203373 filed on Jul. 12, 2002).

Further, such surface treatment can also improve thermophysical properties, such as the thermal conductivity of an organic insulating film, and can control large fluctuation of the thermal treatment properties of the photoresist which is applied on the organic insulating film.

For example, there is a problem that a prebaking temperature becomes abnormally higher than a recommended temperature on the organic insulating film.

In the case of negative/positive reversal type resist by which an overhang structure suitable for a lift-off process can be formed, since the range of heat-treating conditions thereof is narrow, formation of a good pattern is difficult without surface treatment.

As to a ground layer, gas of the organic solvent which is discharged in the middle of the process and remains in the organic insulating layer can be efficiently discharged into the atmosphere by, except for the lowest ground layer, adopting a mesh shaped electrode structure, whereby problems, such as exfoliation in the middle of the process, can be prevented.

Figure 2:
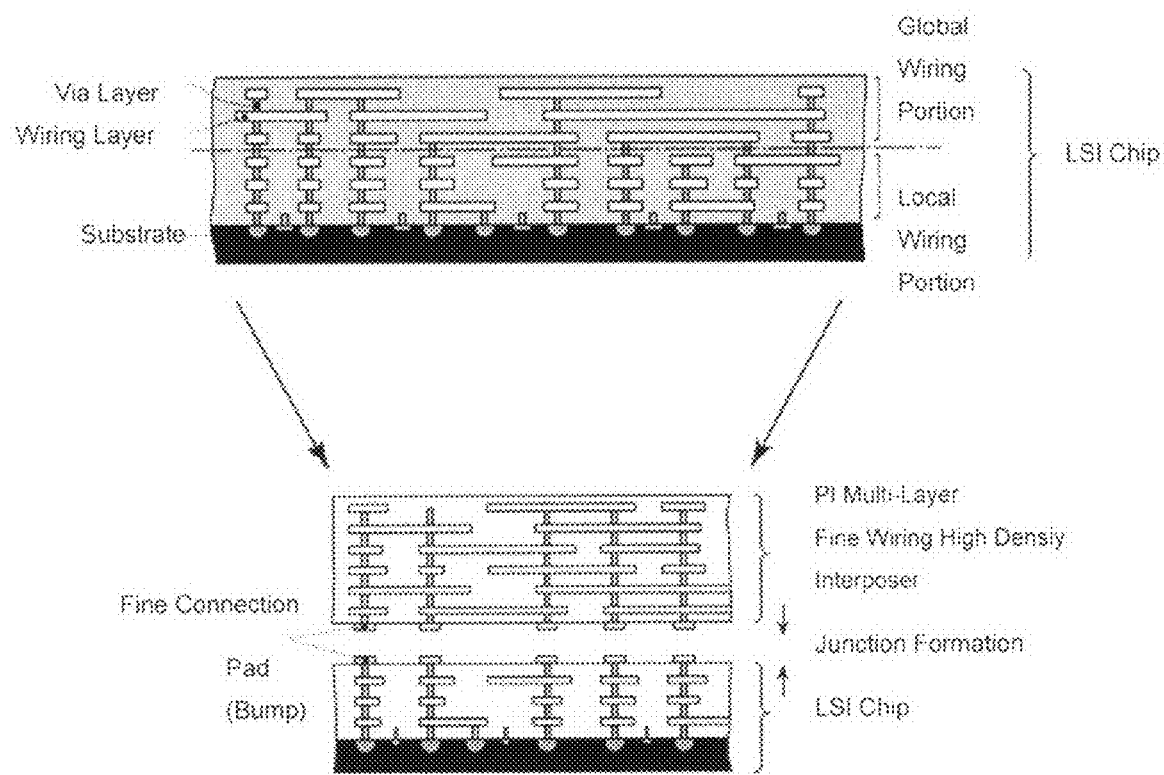
FIG. 2 shows a cross sectional view of a conventional LSI chip and an LSI chip in which the number of layers in a wiring layer portion of the LSI is reduced, and on which an interposer having layers for wiring whose number is larger than that of layers of the wiring layer portion of the LSI is laminated.

FIG. 2 shows a cross sectional view of a conventional LSI chip and an LSI chip in which the number of layers in a wiring layer portion of the LSI is reduced, and on which an interposer having wiring layers whose number is larger than that of layers of the wiring layer portion of the LSI is laminated.

In this example, as shown in the top of FIG. 2, three layers from the top of a wiring layer portion of the conventional integrated circuit (LSI) chip having 6 layers in a wiring layer portion (especially, a global wiring portion for a long distance wiring connection in the chip) are replaced with an interposer having six layers in a wiring layer portion (whose number is twice the number of that of the conventional LSI chip). In order to electrically connect the interposer and the chip in which the number of layers in the wiring layer portion is reduced, metallic junctions are formed by using micron size fine connection metal pads or bumps which are formed on the interposer and the chip as shown in the bottom of FIG. 2.

In this case, the size of the integrated circuit chip can be designed in size so as to be smaller than the conventional integrated circuit chip.

Figure 3:
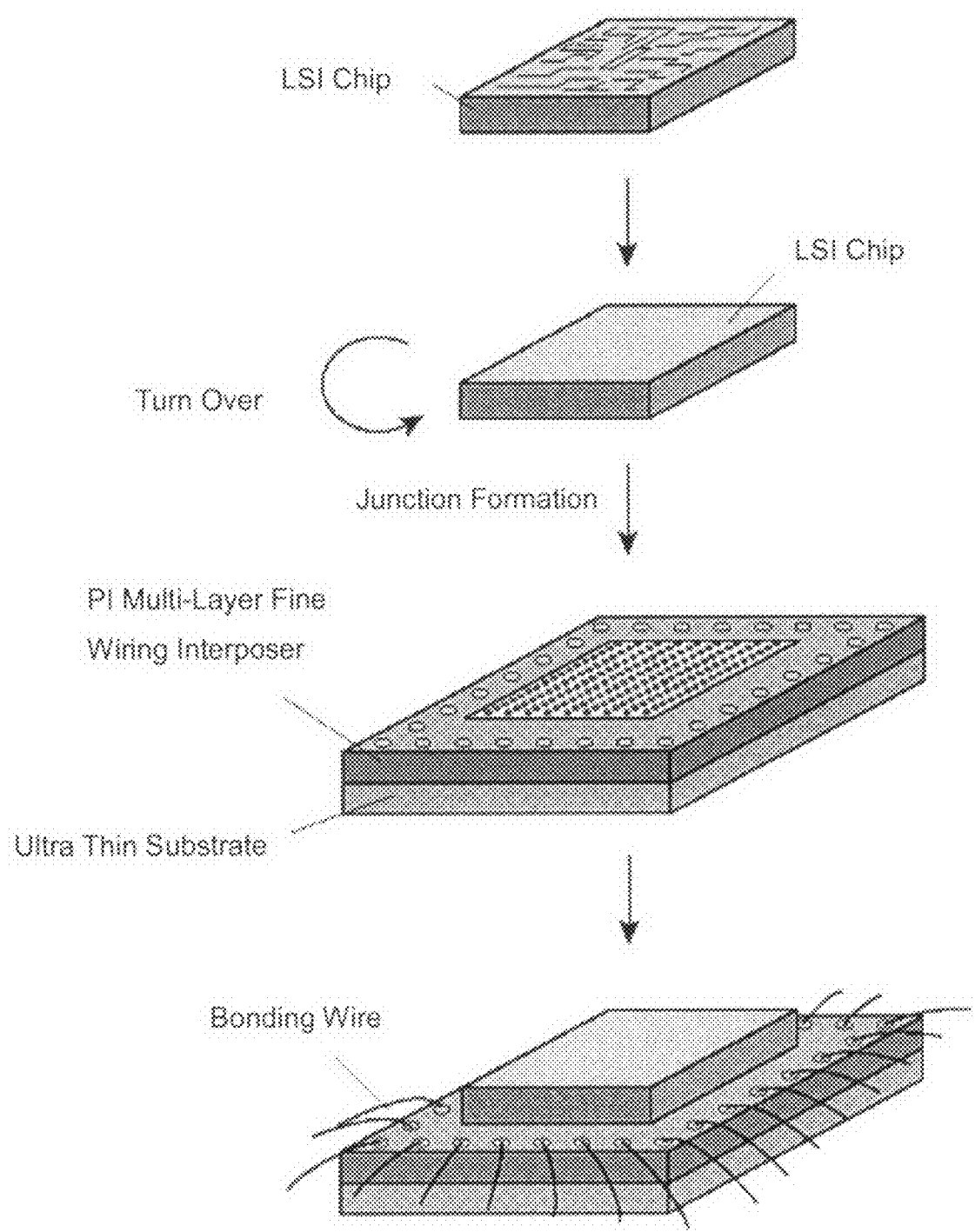
FIG. 3 shows another embodiment of the present invention, wherein an integrated circuit chip and an interposer whose size is larger than that of the chip for an wire bonding pad area.

FIG. 3 shows another embodiment of the present invention, wherein an integrated circuit chip and an interposer with bonding pads and wires are used.

As shown in the top of the FIG. 3, an integrated circuit chip in which the number of layers in a wiring layer portion is reduced, is prepared.

The chip is turned over (as shown in the second from the top of FIG. 3), and, the interposer which has layers in a wiring layer portion, whose number is equal to or larger than the reduced number of layers which is formed on an ultra thin substrate, is prepared. In order to electrically connect the interposer and the chip whose number of layers in the wiring layer portion is reduced, metallic junctions are formed by using micron size fine connection metal pads or bumps which are formed on the interposer and the chip as shown in the third from the top of FIG. 3. Finally, the integrated circuit chip and the interposer are integrated, and mounted on a circuit board etc. as shown in the bottom of FIG. 3.

The bonding pads formed on the interposer are connected to the circuit board by bonding wires.

Figure 4:
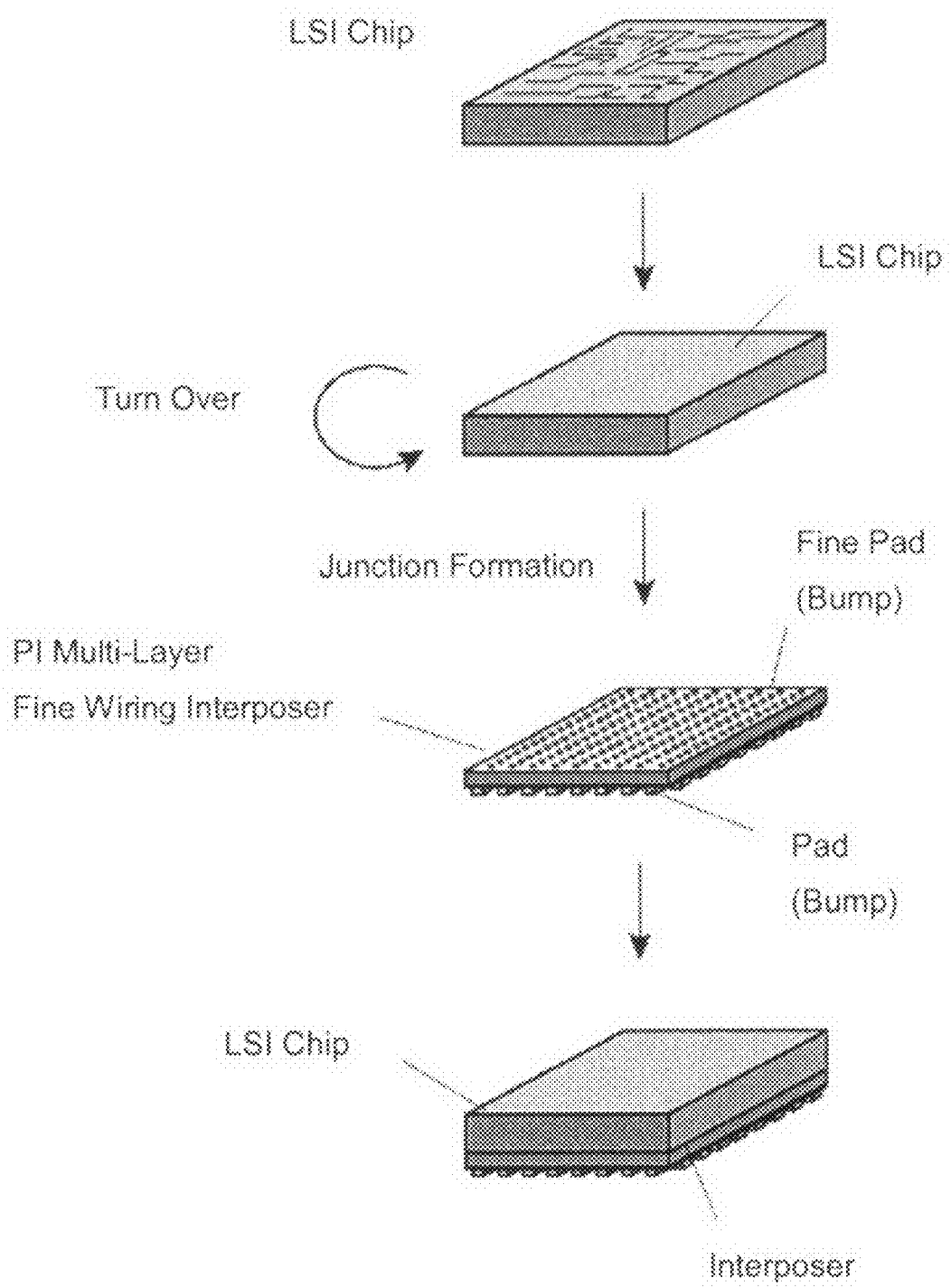
FIG. 4 shows another embodiment of the present invention, wherein an integrated circuit is the same as a chip in size.

FIG. 4 shows another embodiment of the present invention, wherein an integrated circuit is the same as a chip in size.

An integrated circuit chip having layers in the wiring layer portion, whose number is reduced, is prepared as shown in the top of FIG. 4.

The chip is turned over as shown in the second from the top in FIG. 4. An interposer which has layers in the wiring layer portion, whose number is equal to or larger than the number of the layers of the chip, is prepared. In order to electrically connect the interposer and the chip in which the number of layers in the wiring layer portion is reduced, metallic junctions are formed by using micron size fine connection metal pads or bumps which are formed on the interposer and the chip as shown in the third from the top in FIG. 4.

Finally, the integrated circuit chip and the interposer are integrated, and mounted on a circuit board etc. as shown in the bottom of FIG. 4.

On the circuit board, the interposer is mounted through metallic junctions formed by relatively large size pads or bumps which are formed on the lower portion of the interposer.

Figure 5:
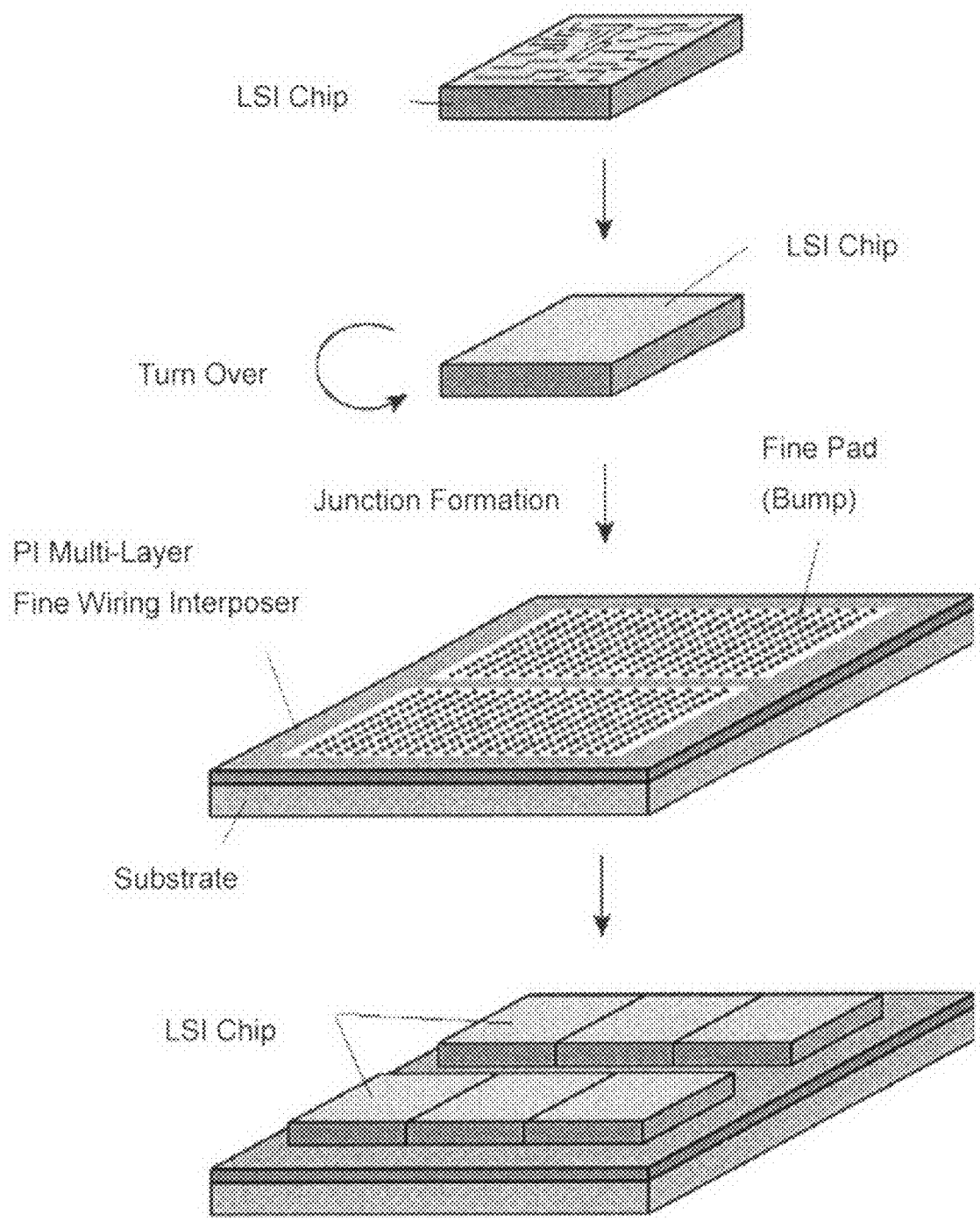
FIG. 5 shows still another embodiment of the present invention wherein two or more integrated circuit chips and a relatively large size interposer are used.

FIG. 5 shows still another embodiment of the present invention wherein two or more integrated circuit chips (6 chips in this embodiment) and a relatively large size interposer are used.

Six integrated circuit chips, in each of which the number of the layers in the wiring layer portion reduced are prepared as shown in the top of FIG. 5.

These chips are turned over as shown in the second from the top in FIG. 5. An interposer which has layers in a wiring layer portion, whose number is equal to or larger than that of layers in a wiring layer portion of the chips, and which is provided on a large substrate capable of mounting all the six chips, is prepared. In order to electrically connect the interposer and the chips in each of which the number of layers in the wiring layer portion are reduced, metallic junctions are formed by using micron size fine connection metal pads or bumps which are formed on the interposers and the chips, as shown in the third from the top in FIG. 5.

Finally, the integrated circuit chip and the interposer are integrated, whereby the entire system is structured as shown in the bottom of FIG. 5.

As the large-sized substrate, a circuit board manufactured by the conventional printed-circuit-board technology may be used.

In this embodiment, two or more chips which are divided from a large size LSI chip are used, so that it is possible to structure the circuit via the interposer just like one chip.

It is an advantage in this embodiment, that it becomes possible to combine different types of chips whose substrate material is different (compound semiconductor chips, such as GaAs, InP, GaAlAs, InGaP, CdTe, GaN, and SiC, a MEMS chip, glass substrate chip, etc.).

Figure 6:
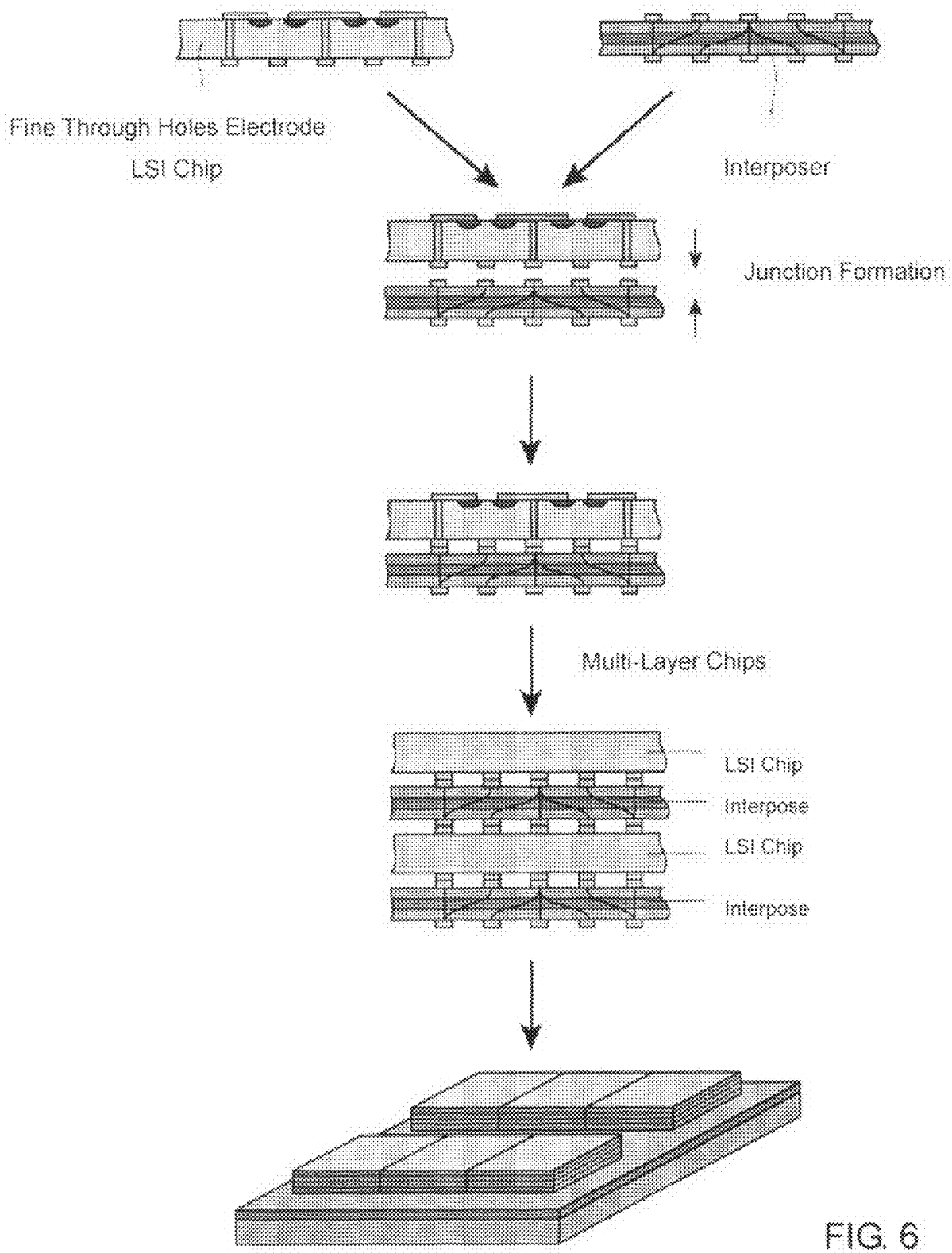
FIG. 6 shows a further embodiment of the present invention, wherein integrated circuit chips in which through electrodes used for 3-dimensional chip layering and interposers which are the same as the integrated circuit chips in size, are used.

FIG. 6 shows a further embodiment of the present invention, wherein integrated circuit chips in which through electrodes used for stacking three or more integrated circuit chips based on 3-dimensional chip stacking technique are provided, and interposers which are the same as the integrated circuit chips in size, are used.

Interposers having fine wiring layers (shown in the top right side of FIG. 6) and a thin integrated circuit chip therefor (shown in the top left side of FIG. 6) having through electrodes are prepared. In order to electrically connect the interposer and the thin chip, metallic junctions are formed by using micron size fine connection metal pads or bumps which is formed on the interposer and the thin chip. Finally, two or more pairs of a thin chip and an interposer are stacked so as to be mounted on a large size interposer.

In the figure, an example of six stacked structures, each of which is made up of two pairs of an interposer and a thin chip are mounted is shown.

The large size interposer corresponds to the interposer formed on the large substrate shown in the third from the top in FIG. 5.

For example, the 3-dimensional chip stacking technology is disclosed in the Japanese Laid Open Patent No. 2002-203373.

As a reference example, the fine multi-layer wiring structure in an interposer and a method for manufacturing the structure according to the present invention is disclosed in Laid Open Patent No. 2003-309121 (Japanese Patent Application No. 2002-112890) filed on Apr. 16, 2002, which is entitled as "a multi-layer fine wiring structure and a manufacturing method therefore."

The metallic junctions between the integrated circuit chip and the interposer are preferably formed at as low a temperature lower than 150 degrees Celsius as possible in order to reduce residual stress after the formation of the junctions.

For example, the junction formation technology at a low temperature of 100 degrees Celsius low using a Pb/In alloy is disclosed in Japanese Patent No. 3213722.

In addition, the junction may be formed by using metallic material such as Sn/Bi (melting point of 138 degrees Celsius), Sn/Pb/Bi (melting point of 135 degrees Celsius), Sn/In (melting point of 117 degrees Celsius), In (melting point of 156 degrees Celsius), etc.

However, since these materials have property which is very easily oxidizable, in order to form the junctions with stable repeatability, it is necessary to introduce a step for removing an oxide film by, for example, a plasma cleaning process for cleaning the surface right before the formation of the junctions while making an atmosphere where oxygen and moisture are reduced as much as possible, as means for controlling oxidization.

In the above-mentioned embodiments, the number layers in the interposer is equal to or larger than the number of layers in the chip, which is reduced, the present invention is not limited to it. The number of the layer in the interposer may be smaller than the number of layers reduced.

Thus the present invention possesses a number of advantages or purposes, and there is no requirement that every claim directed to that invention be limited to encompass all of them.

The disclosures of Japanese Patent Application Nos. 2003-175743 filed on Jun. 20, 2003, and 2003-320295 filed on Sep. 11, 2002 including specification, drawings and claims thereof are incorporated herein by reference in its entirety.

Although only some exemplary embodiments of this invention have been described in detail above, those skilled in the art will readily appreciate that many modifications are possible in the exemplary embodiments without materially departing from the novel teachings and advantages of this invention.

Accordingly, all such modifications are intended to be included within the scope of this invention. Thus the present invention possesses a number of advantages or purposes, and there is no requirement that every claim directed to that invention be limited to encompass all of them.

Although only some exemplary embodiments of this invention have been described in detail above, those skilled in the art will readily appreciate that many modifications are possible in the exemplary embodiments without materially departing from the novel teachings and advantages of this invention.

Accordingly, all such modifications are intended to be included within the scope of this invention.

What is claimed is:

1. A method for making an interposer having a multi-layer wiring structure, the method comprising the following steps of:
    forming a first resist pattern for forming at least one first extraction electrode on a substrate,
    depositing a first ground layer thereon,
    removing a film on the first resist pattern by a lift-off method,
    forming a first photosensitive organic film thereon by a spin-on coating, using high resolution photosensitive organic material,
    forming at least one first via hole in the first photosensitive organic film by exposure and development,
    filling the at least one first via hole with metal by a plating method,
    forming a second resist pattern in order to form a first wiring,
    depositing a first wiring layer portion,
    removing a film on the second resist pattern by a lift-off method,
    forming a second photosensitive organic film thereon by a spin-on coating, using high resolution photosensitive organic material,
    forming at least one second via hole in the second photosensitive organic film by exposure and development,
    filling the at least one second via hole with metal by a plating method,
    forming a third resist pattern in order to form a second wiring,
    depositing metal as a second wiring layer portion,
    removing a film on the third resist pattern by a lift-off method,
    forming a third photosensitive organic film thereon by a spin-on coating, using high resolution photosensitive organic material,
    forming at least one third via hole in the third photosensitive organic film by exposure and development,
    filling the at least one third via hole with metal by a plating method,
    forming a forth resist pattern in order to form at least one second extraction electrode,
    depositing metal as a second ground layer,
    removing a film on the forth resist pattern by a lift-off method,
    forming a forth photosensitive organic film thereon by a spin-on coating, using high resolution photosensitive organic material,
    forming at least one first bump hole in the forth photosensitive organic film by exposure and development,
    filling the at least one first bump hole with metal by a plating method,
    grinding the substrate so as to be thin,
    exposing the second ground layer by dry etching,
    forming a fifth photosensitive organic film thereon by a spin-on coating, using high resolution photosensitive organic material,
    forming at least one second bump hole in the fifth photosensitive organic film by exposure and development,
    filling the at least one second bump hole with metal by a plating method.

2. The method according to claim 1, wherein at least one of the first and second ground layers is made of copper, silver, gold, aluminum, palladium, indium, titanium, tantalum, or niobium, and the metal with which at least one of the first, second, and third via holes and the first and second bump holes is filled with is copper, silver, gold, aluminum, palladium, indium, titanium, tantalum, or niobium.

3. The method according to claim 1, wherein the photosensitive organic material is polyimide.

4. The method according to claim 1, wherein at least one of the first and second photosensitive organic films is formed on noble metal and thin aluminum is deposited on the noble metal.

* * * * *